United States Patent [19]

Boeglin

[11] Patent Number: 5,053,255
[45] Date of Patent: Oct. 1, 1991

[54] CHEMICAL VAPOR DEPOSITION (CVD) PROCESS FOR THE THERMALLY DEPOSITING SILICON CARBIDE FILMS ONTO A SUBSTRATE

[75] Inventor: Herman J. Boeglin, Waterbury, Conn.

[73] Assignee: Olin Corporation, Chesire, Conn.

[21] Appl. No.: 553,919

[22] Filed: Jul. 13, 1990

[51] Int. Cl.$^5$ .............................................. C23C 16/32
[52] U.S. Cl. ........................................................ 427/249
[58] Field of Search ........................... 427/38, 39, 249

[56] References Cited

U.S. PATENT DOCUMENTS

| | | | |
|---|---|---|---|
| 4,459,338 | 7/1984 | Angelini et al. | 427/249 |
| 4,460,669 | 7/1984 | Ogawa et al. | 427/74 |
| 4,810,526 | 3/1989 | Ito et al. | 427/50 |
| 4,877,641 | 10/1989 | Dory | 427/38 |
| 4,877,651 | 10/1989 | Dory | 427/255 |
| 4,923,716 | 5/1990 | Brown et al. | 427/249 |

OTHER PUBLICATIONS

D. Cagliostro et al., "Analysis of the Pyrolysis Products of Dimethyldichlorosilane in the Chemical Vapor Deposition of Silicon Carbide in Argon", J. Am. Ceram. Soc. 73 (1990).
M. L. Pearce et al., "Formation of Silicon and Titanium Carbides by Chemical Vapor Deposition", J. Am. Ceram. Soc., 51 (1968).
Richard D. Veltri et al., "Chemical Vapor Deposited SiC Matrix Composites", J. Am. Caram. Soc., 72 (1989).
A. Mestari et al., "Evidence for Free Caron in Amorphous OMCVD Silicon-Rich $Si_xC_{1-x}$ Coatings", Journal de Physique, vol. 50, May, 1989.
F. Langlais et al., "On The Kinetics of the CVD of Si from $SiH_2Cl_2H_2$ and SiC from $CH_3SiCl_3/H_2$ in a Vertical Tubular Hot-Wall Reactor", Journal de Physique, vol. 50, May, 1989, pp. 93-103.
S. Patai et al., "The Chemistry of Organic Silicon Compounds", John Wiley & Sons (1989), pp. 1233-1234.
R. Brutsch, "Chemical Vapour Deposition of Silicon Carbide an its Applications", Thin Solid Films 126 (1985), pp. 313-318.
Y. G. Roman et al., "Silicon Carbide Chemical Vapour Infiltration", Journal de Physique, vol. 50, May, 1989.

Primary Examiner—Shrive Beck
Assistant Examiner—Margaret Burke
Attorney, Agent, or Firm—William A. Simons

[57] ABSTRACT

A thermal CVD process for forming silicon carbide-type films onto a substrate comprising the steps of:
(a) introducing di-tert-butylsilane vapor into a CVD reaction zone containing said substrate on which a silicon carbide film is to be formed;
(b) maintaining the temperature of said zone and said substrate at about 400° C. to about 1,100° C.;
(c) maintaining the pressure in said zone at about 0.1 to about 10 torr; and
(d) passing said vapor into contact with said substrate for a period of time sufficient to form a silicon carbide-type film thereon.

12 Claims, No Drawings

CHEMICAL VAPOR DEPOSITION (CVD) PROCESS FOR THE THERMALLY DEPOSITING SILICON CARBIDE FILMS ONTO A SUBSTRATE

CROSS-REFERENCE TO RELATED PATENT APPLICATIONS

This application is related to U.S. Pat. Application entitled "Chemical Vapor Deposition (CVD) Process for Thermally Depositing Silicon Carbide Films Onto a Substrate" Ser. No. 553,918, filed 7/13/90 filed in the name of the same inventor simultaneously with this patent application.

BACKGROUND OF THE INVENTION

1. Field of the Invention

The present invention relates to a Chemical vapor deposition (CVD) process for plasma depositing a silicon carbide film onto a substrate.

2. Brief Description of The Prior Art

Chemical vapor deposition (CVD) is used through the microelectronics industry for semiconducting and insulating thin film deposition. When films such as silicon carbide are deposited, silane ($SiH_4$) is generally used as the gaseous silicon source.

Silicon carbide (SiC) films are used in solar cells, as X-ray lithographic masks, and as hard coatings on machining tools. Silicon carbide has the necessary electrical properties for use in solar cells and has good physical properties.

Silane is highly toxic and spontaneously ignites when exposed to air. It requires the use of expensive gas cabinets and a cross-Purging gas supply system. Special purging Procedures are needed before introduction into deposition equipment. A number of silicon containing chemicals have been used or proposed as alternative silane sources. These include silicon tetrachloride ($SiCl_4$), silicon tetrabromide ($SiBr_4$), silicon tetrafluoride ($SiF_4$), dichlorosilane ($SiH_2Cl_2$), and disilane ($Si_2H_6$). All halogen-containing silanes are toxic and corrosive themselves in addition to producing toxic and corrosive by-products. Disilane is a flammable, toxic gas that requires similar handling procedures to silane. Also, use of these alternative silicon sources requires an additional reactant such as methane to supply carbon to the deposition process to form the silicon carbide film. Other chemicals such as tetraethylorthosilicate [TEOS, $Si(OC_2H_5)_4$] and tetramethylcyclotetrasiloxane (TMCTS, $C_4H_{16}Si_4O_2$) can only be used for oxide deposition.

Accordingly, there is a need for better alternatives to silane as a precursor for depositing silcon carbide films in CVD Processes.

U.S. Pat. No. 4,459,338, which issued to Angelini, et al. on July 10, 1984, teaches a CVD process for applying silicon carbide onto a film by contacting the substrate with a gaseous mixture of methylsilane and an inert gas while heating the gaseous mixture and the substrate to about 800°–1,050° C.

U.S. Pat. No. 4,810,526, which issued to Ito, et al., on Mar. 7, 1989, teaches a CVD Process for applying silicon carbide onto a substrate in a heated furnace by introducing a feedstock gas containing a single silicon and carbon source (e.g., trichloromethylsilane) into the heated furnace under a vacuum.

U.S. Pat. No. 4,923,716, which issued to Brown, et al., on May 8, 1990, teaches a CVD process for depositing silicon carbide from a vapor source having a single molecular species that has both silicon and carbon atoms in equal numbers. Preferred molecular sources include $H_3SiCH_2SiH_3$; a silacycloalkane of the form $(-SiH_2CH_2-)_p$, where p is 2, 3, 4, or 5, or a cyclic structure of the form $[-SiH(CH_3)-]_q$, where q is 4 or 5.

Separately, di-tert-butylsilane (DTBS) is a known chemical with a Chemical Abstracts registry number [30736-07-3]. Processes for making DTBS are disclosed by Wataname, et al. "A Simple and Convenient Method for Preparing Di-t-Butyl Silanes", Chemistry Letters, pp. 1321–1322, 1981; Doyle, et al. "Hindered Organosilicon Compounds, Synthesis and Properties of Di-tert-butyl-, Di-tert-butylmethyl-, and Tri-tert-butylsilanes", J. Am. Chem. Soc. 97, Pp. 3777–3782 (1975); and Triplett, et al. "Synthesis and Reactivity of Some t-Butyl-Disilanes and Digermanes", Journal of Organometallic Chemistry, Vol. 107, pp. 23–32 (1976). All three of these articles are incorporated herein by reference in their entireties. DTBS has been used as a silylation agent to hydroxy compounds (CA 101:91218v) and as an intermediate in the production of di-tert-butyldichlorosilane (CA 98:126375t).

Also, DTBS has been used as a silicon source for depositing silicon nitride or silicon dioxide by either thermal or plasma CVD Processes. See U.S. Pat. Nos. 4,877,641 and 4,877,651, both of which issued to Thomas S. Dory on Oct. 31, 1989. Both of these U.S. patents are incorporated herein by reference in their entireties.

Di-tert-butylsilane (DTBS) is an air-stable, noncorrosive liquid. It is soluble in many organic solvents and does not react with water. Its high vapor pressure at room temperature allows for easy introduction into CVD reactors. No gas cabinets or cross-purging systems are needed in order to use this chemical in CVD reactors. The decomposition by-products are not corrosive in nature. Also, in the deposition of silicon carbide, DTBS can be used by itself to form the film since it contains the required carbon to form silicon carbide. Di-tert-butylsilane represents an air-stable liquid source that can be used for the deposition of silicon. This eliminates the need for using the flammable, toxic chemical, silane, and eliminates the need for an additional reactant to supply carbon for for the deposition process.

BRIEF SUMMARY OF THE INVENTION

Accordingly, the present invention is directed to a thermal CVD process for forming silicon carbide-type films onto a substrate comprising the steps of:

(a) introducing di-tert-butylsilane gas into a CVD reaction zone containing said substrate on which a silicon carbide film is to be formed;

(b) maintaining the temperature of said zone and said substrate from about 100° C. to about 400° C.;

(c) maintaining the pressure in said zone from about 0.1 to about 10 torr; and (d) Passing said gas into contact with said substrate for a period of time sufficient to form a silicon carbide-type film thereon.

DETAILED DESCRIPTION

The CVD Process of this invention may be used to produce silicon carbide-type or SiC type films having an optimum refractive index in the range from about 2.6±0.4. The lower the refractive index in this range, the higher the carbon percentage; and the higher the refractive index in this range, the higher the Si percentage. The terms "silicon carbide-type films" and "SiC-type films", as used herein, mean films formed with a refractive index in the above optimum range.

Substances may be any material on which a silicon carbide-type film is desired, e.g., silicon wafers, Plastic, resin, glass, or metal objects or films; GaAs layers; or any semiconductor layer or device, preferably those employing Groups II to V of the Periodic Table of Elements or compounds thereof. The substrate is heated to the reaction temperature by a resistance element in a reaction chamber into which the vapor is introduced. In a preferred embodiment of the process, the reaction chamber is prepared for film production by the preliminary step of passivating the chamber with a silicon carbide-type coating of this invention.

While not critical, it is preferred to maintain the reaction chamber isothermal, by which is meant having temperature variations throughout of less than 2° C., preferable ±1° C. The reactant vapor is input at a sufficient distance from the wafers to be coated to permit the vapor to reach reaction temperature. Compared to the wafer mass, the vapor, at its input temperature, will not appreciably cool the wafer.

The vapor is introduced in a substantially laminar flow over the substrate surface. The residence time over the substrate is kept short to eliminate substantial concentration variations over the wafer. The substrate, typically an Si wafer, is preferably confined in a manner so as to provide a reaction chamber wall to wafer edge spacing and wafer to adjacent wafer spacing, such that the silicon carbide-type film produced by the process of this invention is substantially uniform across the wafer surface, i.e., does not exhibit substantial concavity (edge build-up) or convexity (center mounding). An example of appropriate spacing of wafer to wafer and wafer to chamber wall are discussed in Becker, et al. "Low-Pressure Deposition of High-Quality SiO$_2$ films by Pyrolysis of Tetraethylorthosilicate". J. Vac Soc. Techno. B, Vol. 6, No 6 pp 1555-1563 (Nov./Dec., 1987). Film uniformity obtained preferably exhibits less than ±3% thickness variation, both within (across) the wafers, and from wafer to wafer in a batch or production run.

Typical gas flow rates may be on the order of from 10 to about 400 standard cc/min. for the DTBS. The Preferred gas flow rate range is about 20 to about 200 sccm.

As mentioned above, the reaction chamber pressures are controlled in the range of from about 0.1 torr to about 10 torr. The preferred range being from about 0.5 to 5 torr. As also mentioned above, the reaction temperature is from about 400° C. to 1,100° C. The preferred temperature range is about 500° C. to about 750° C.

The film formation rate is typically in the range of from about 10 to about 500 Angstroms/minute with typical operating rates of from about 15-300 Å/min., with the optimum being about 20-200 Å/min. at an optimum pressure of about 0.75-2.0 torr at an optimum temperature range from about 550° C. to 650° C.

The following example further illustrates the present invention. All parts and percentages are by weight unless explicitly stated otherwise.

THERMAL DEPOSITION OF SILICON CARBIDE (SiC) EMPLOYING DTBS AS A REACTANT

For this example, a three zone horizontal tube furnace with a four inch silicon wafer capacity manufactured by CVD Equipment Corporation of Deer Park, N.Y. equipped with a quartz furnace tube and quartz wafer boat was used. The quartz tube was connected to a Model 88102119HQ vacuum pumping system manufactured by Alcatel Vacuum Products of Hingham, Mass. Gas control to the system was accomplished by use of a DynaMass flow control system (Model DM-1400) and UltraFlo mass flow controllers (Model UC2-31) manufactured by Vacuum General of San Diego, CA. Vapor control to the system was accomplished by use of a Model LC2-41VS01 mass flow controller also manufactured by Vacuum General of San Diego. Pressure control of system was accomplished by use of an AdapTorr throttle valve control system (Model AC-2) and a motorized throttle valve attached to the exit end of the furnace tube (Model MDVX-015) also manufactured by Vacuum General of San Diego. Liquid di-tert-butylsilane was contained in a 1.2 liter capacity stainless steel ampule, and the temperature of the ampule was maintained at 40° C. by using a source controller (Model 875) manufactured by Olin Hunt Corporation of Seward, Ill. Vapor from the DTBS was fed to the vapor mass flow controller. The quartz wafer boat was fitted inside the quartz tube and held four inch silicon wafers in a vertical orientation. The loaded quartz wafer boat was placed in the second zone of the furnace.

After loading the furnace (previously heated to 550° C. in three zones) with the quartz boat and 7 wafers, the vacuum pumping system was used to evacuate the furnace tube to a base pressure of 0.030 torr. DTBS vapor at a flow rate of 100 sccm was introduced into the furnace tube through an inlet attached to the door at the first zone of the furnace. Soon after the DTBS flow was started, the pressure in the furnace tube was brought up to 1.0 torr by means of the throttle valve.

Reaction and decomposition of the DTBS vapor formed silicon carbide surfaces on the silicon wafers in the quartz boat. After 30 minutes, the throttle valve was fully opened, the DTBS flow was stopped, and nitrogen gas introduced to Purge the system. After flushing the system for a sufficient time, the system was vented and the quartz boat removed.

The silicon carbide films on the silicon wafers were examined. A sputtered AUGER profile was done on a sample of the film. The results of the profile indicated that the average silicon carbide thickness was 585 Å. The average atomic concentration of silicon and carbon in the film was measured at 47% each with the remainder being oxygen. These results indicate that a good silicon carbide film was deposited on the silicon wafers.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A thermal CVD process for forming silicon carbide-type films onto a substrate comprising the steps of:
    (a) introducing di-tert-butylsilane vapor into a CVD reaction zone containing said substrate on which a silicon carbide film is to be formed;
    (b) maintaining the temperature of said zone and said substrate at about 400° C. to about 1,100° C.;

(c) maintaining the Pressure in said zone at about 0.1 to about 10 torr; and (d) Passing said vapor into contact with said substrate for a period of time sufficient to form a silicon carbide-type film thereon.

2. The thermal CVD process of claim 1, wherein the flow rate of said di-tert-butylsilane into said zone is from about 25 sccm to about 400 sccm.

3. The thermal CVD Process of claim 1, wherein said zone temperature and said substrate temperature are from about 500° C. to about 750° C.

4. The thermal CVD process of claim 1, wherein said zone pressure is from about 0.5 torr to about 5 torr.

5. The thermal CVD process of claim 1, wherein said di-tert-butylsilane film rate is formed at a rate from about 10 to about 500 Angstroms/minute.

6. The thermal CVD process of claim 1, wherein said substrate is selected from the group consisting of resin objects or films, glass objects or films, metal objects or films, GaAs layers, and semiconductor layers or devices.

7. A thermal CVD process for forming silicon carbide-type film onto a substrate comprising the steps of:
(a) introducing di-tert-butylsilane vapor into a CVD reaction zone containing said substrate on which a silicon carbide film is to be formed; the flow rate of said di-tert-butylsilane into said zone is from about 10 sccm to about 400 sccm;

(b) maintaining the temperature of said zone and said substrate at about 500° C. to about 750° C.;

(c) maintaining the pressure of said zone at about 0.5 torr to about 5 torr; and (d) passing said gas into contact with said substrate for a period of time sufficient to form a silicon carbide-type film thereon, the rate of film formation being at about 10 to about 500 Angstroms per minute.

8. The thermal CVD process of claim 7, wherein said flow rate of di-tert-butylsilane is from about 20 to about 200 sccm.

9. The thermal CVD process of claim 7, wherein said temperature is from about 550° C. to about 650° C.

10. The thermal CVD process of claim 7, wherein said Pressure is from about 0.75 to about 2.0 torr.

11. The thermal CVD process of claim 7, wherein said film formation rate is from about 15 to about 300 Angstroms per minute.

12. The thermal CVD process of claim 7, wherein said substrate is selected from the group consisting of resin objects or films, glass objects of films, metal objects or films, GaAs layers, and semiconductor layers or devices.

* * * * *